US011900212B1

(12) United States Patent
Zeng et al.

(10) Patent No.: US 11,900,212 B1
(45) Date of Patent: *Feb. 13, 2024

(54) CONSTRUCTING QUANTUM PROCESSES FOR QUANTUM PROCESSORS

(71) Applicant: Rigetti & Co, LLC, Berkeley, CA (US)

(72) Inventors: William J. Zeng, Berkeley, CA (US); Chad Tyler Rigetti, Walnut Creek, CA (US)

(73) Assignee: Rigetti & Co, LLC, Berkeley, CA (US)

( * ) Notice: Subject to any disclaimer, the term of this patent is extended or adjusted under 35 U.S.C. 154(b) by 231 days.

This patent is subject to a terminal disclaimer.

(21) Appl. No.: 17/185,675

(22) Filed: Feb. 25, 2021

Related U.S. Application Data

(63) Continuation of application No. 16/401,848, filed on May 2, 2019, now Pat. No. 10,949,768, which is a continuation of application No. 15/419,682, filed on Jan. 30, 2017, now Pat. No. 10,325,218.

(60) Provisional application No. 62/306,149, filed on Mar. 10, 2016.

(51) Int. Cl.
| | |
|---|---|
| *G06F 11/10* | (2006.01) |
| *G11C 16/26* | (2006.01) |
| *G11C 16/20* | (2006.01) |
| *G11C 16/04* | (2006.01) |
| *G06N 10/00* | (2022.01) |
| *G01R 31/3177* | (2006.01) |

(Continued)

(52) U.S. Cl.
CPC ......... *G06N 10/00* (2019.01); *G01R 31/3177* (2013.01); *G06N 3/08* (2013.01); *G06N 20/00* (2019.01)

(58) Field of Classification Search
CPC .............................. G06N 20/00; G06N 10/00
See application file for complete search history.

(56) References Cited

U.S. PATENT DOCUMENTS 10,325,218 B1 * 6/2019 Zeng ...................... G06N 10/00
10,949,768 B1 * 3/2021 Zeng ...................... G06N 10/00
(Continued)

FOREIGN PATENT DOCUMENTS

WO 2015178990 A2 11/2015

OTHER PUBLICATIONS

USPTO, Non-Final Office Action dated Oct. 12, 2018, in U.S. Appl. No. 15/419,682, 13 pgs.
(Continued)

*Primary Examiner* — Guy J Lamarre
(74) *Attorney, Agent, or Firm* — Henry Patent Law Firm PLLC

(57) ABSTRACT

In a general aspect, a quantum process for execution by a quantum processor is generated. In some instances, test data representing a test output of a quantum process are obtained. The test data are obtained based on a value assigned to a variable parameter of the quantum process. An objective function is evaluated based on the test data, and an updated value is assigned to the variable parameter based on the evaluation of the objective function. The quantum process is provided for execution by a quantum processor, and the quantum process provided for execution has the updated value assigned to the variable parameter.

23 Claims, 4 Drawing Sheets

(51) Int. Cl.
*G06N 20/00* (2019.01)
*G06N 3/08* (2023.01)

(56) References Cited

U.S. PATENT DOCUMENTS

2014/0187427 A1 7/2014 Macready et al.
2017/0177534 A1 6/2017 Mohseni et al.

OTHER PUBLICATIONS

USPTO, Non-Final Office Action dated Mar. 12, 2020, in U.S. Appl. No. 16/401,848, 15 pgs.
USPTO, Final Office Action dated Dec. 11, 2020, in U.S. Appl. No. 16/401,848, 5 pgs.
USPTO, Notice of Allowance dated Dec. 24, 2020, in U.S. Appl. No. 16/401,848, 8 pgs.
USPTO, Notice of Allowance dated Feb. 12, 2019, in U.S. Appl. No. 15/419,682, 8 pgs.
Bishop, Christopher M., "Pattern Recognition and Machine Learning", Springer, 2006, 758 pages.
Boyd, Stephen, et al., "Convex Optimization", Cambridge University Press, 2004, 730 pages.
Geller, Michael R., et al., "Universal quantum simulation with prethreshold superconducting qubits: Single-excitation subspace method", arXiv:1505.04990v2 [quant-ph], Sep. 15, 2015, 25 pages.
McClean, Jarrod R., et al., "The theory of variational hybrid quantum-classical algorithms", arXiv:1509.04279v1 [quant-ph], Sep. 14, 2015, 20 pages.
O'Malley, P. J., et al., "Scalable Quantum Simulation of Molecular Energies", arXiv:1512.06860v1 [quant-ph], Dec. 21, 2015, 12 pages.
Peruzzo, Alberto, et al., "A variational eigenvalue solver on a quantum processor", arXiv:1304.3061v1 [quant-ph], Apr. 10, 2013, 10 pages.
Ryan, Conor, et al., "Grammatical Evolution: Evolving Programs for an Arbitrary Language", Springer Science & Business Media, 2012, 13 pages.
Wecker, Dave, et al., "Towards Practical Quantum Variational Algorithms", arXiv:1507.08969v2 [quant-ph], Sep. 8, 2015, 11 pages.

\* cited by examiner

CONSTRUCTING QUANTUM PROCESSES FOR QUANTUM PROCESSORS

CROSS-REFERENCE TO RELATED APPLICATIONS

This application is a continuation of U.S. patent application Ser. No. 16/401,848, filed May 2, 2019, entitled "Constructing Quantum Processes for Quantum Processors," which is a continuation of U.S. patent application Ser. No. 15/419,682, filed Jan. 30, 2017, entitled "Constructing Quantum Processes for Quantum Processors," which claims priority to U.S. Provisional Application No. 62/306,149, filed Mar. 10, 2016, entitled "Constructing Quantum Algorithms." The entire contents of the above-referenced priority applications are hereby incorporated by reference.

BACKGROUND

The following description relates to constructing quantum processes for quantum processors.

Quantum computers can perform computational tasks by executing quantum algorithms. Quantum algorithms are often expressed in terms of quantum logic operations applied to qubits. A variety of physical systems have been developed for quantum computing applications. Examples include superconducting circuits, trapped ions, spin systems and others.

DETAILED DESCRIPTION

Figure 1A:
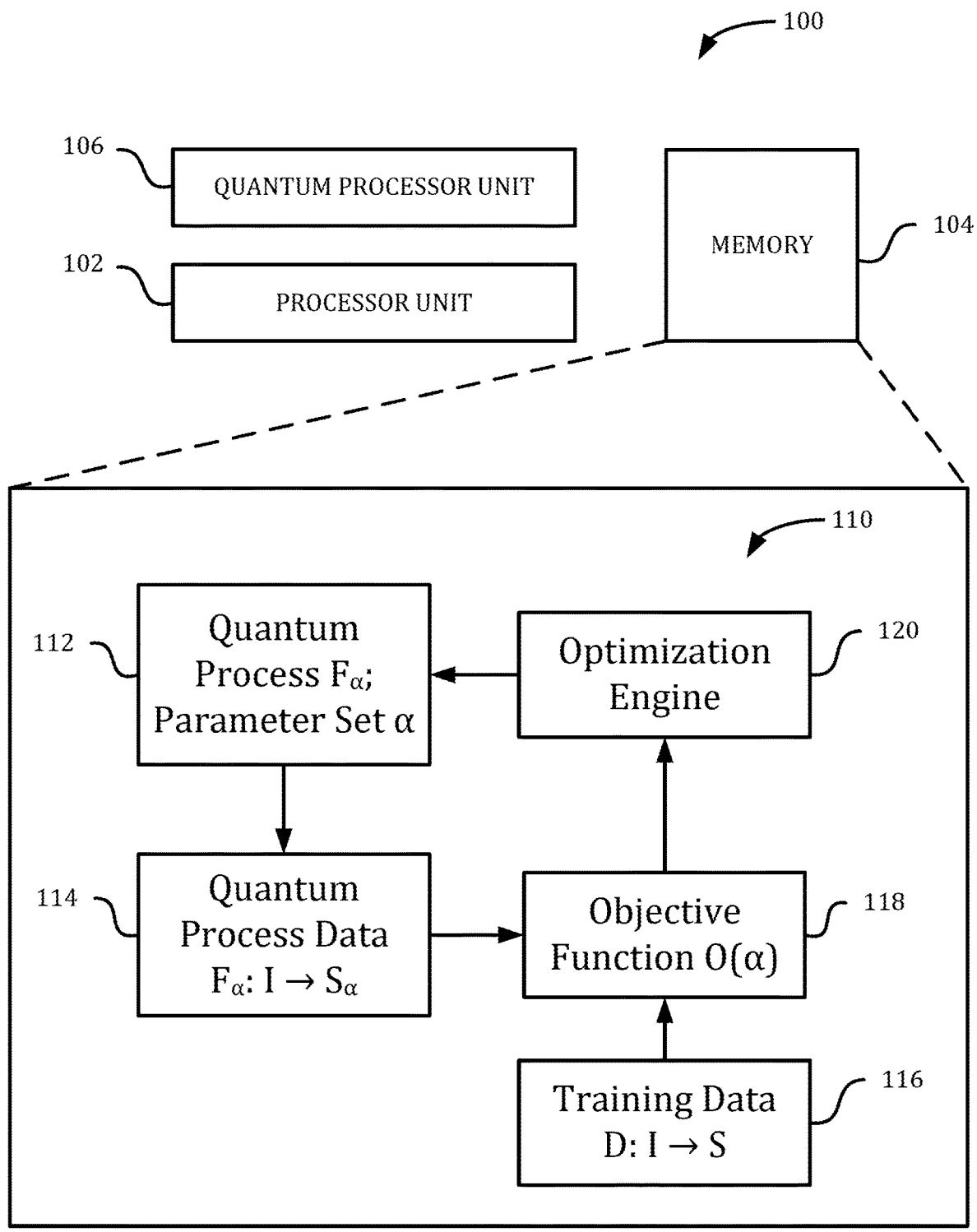
FIG. 1A is a block diagram of an example computer system.

In some aspects of what is described here, a quantum process is constructed that will, from a given input data set, produce a desired output data set, either exactly or up to some specified error. In some examples, the quantum process is represented as a quantum logic circuit, a quantum logic gate, a classical control operation or set of one or more of these. The quantum process can be constructed using an objective function over the input and output data set. For example, a training process can improve (e.g., reduce, minimize, increase, maximize or otherwise improve) the objective function over the input and output data set. The training process can be executed, for example, using a classical simulator, a classical computer, quantum computing hardware, other types of systems or a combination of these.

In some examples, a quantum process can be constructed (e.g., generated, improved, modified, etc.) for execution by a specified target quantum device or category of devices. In some cases, the quantum process can be constructed without a requirement to model the target quantum device's intrinsic noise. For example, the device itself can be used to directly incorporate noise into the training process in some implementations. In some cases, quantum logic circuits are constructed from quantum logic gates that can be realized in a given quantum processor system architecture. The system architecture may specify, for example, parameters of a quantum computing system for which a quantum process is constructed. For instance, the system architecture may specify which qubits are coupled to each other, which couplings are used to perform certain quantum logic gates, and other parameters.

Some aspects of the techniques described here can provide technical improvements and other advantages, for example, for quantum computing systems and other types of quantum technologies. In some instances, a more optimal implementation of a quantum algorithm can be found without requiring complex theoretical characterizations of the quantum processor's execution. In some instances, a quantum logic circuit can be optimized (or otherwise improved) for execution on small and noisy quantum processor chips. For instance, a classical simulator may emulate the noise profile of the quantum processor chip hardware during the construction of the quantum logic circuit, and, if the quantum logic circuits are run on the quantum processor chip hardware, their performance can account for the actual noise profile of the quantum processor chip hardware. This approach may allow the use of machine learning to design quantum processes that make the best (or better) use of the available hardware. Further, this approach can be used to tune existing quantum processes to improve their performance on real hardware. One of the examples described below relates to generating an ansatz and parameters for quantum variational eigensolvers (QVEs). Other examples relate to compiling quantum logic gate sequences, parameterizing classical control signals for a quantum processor and constructing other types of quantum processes.

FIG. 1A is a block diagram of an example computer system 100. The example computer system 100 shown in FIG. 1A includes a memory 104 and two distinct processors: a first processor unit 102 and a quantum processor unit 106. The computer system 100 may include additional or different components.

The example first processor unit 102 can include any type of data processing hardware device. In some instances, the first processor unit 102 is a general purpose classical microprocessor that can run applications and programs by executing or interpreting software, scripts, functions, executables, and other types of computer program code. In some cases, the first processor unit 102 is programmed to control operation of a computing system (e.g., a server, a server cluster, a desktop computer, etc.), for instance, by executing an operating system, a virtual machine, or another type of computing system platform. In some cases, the first processor unit 102 is a specialized processor that is optimized for a class (or classes) of operations.

In some cases, the first processor unit 102 can be implemented on a dedicated chip or chipset, or it can be integrated with other devices on a shared chip. In some implementations, the first processor unit 102 can be or include a single-core processor, a multi-core processor that includes multiple processing units, or another type of processor. In some implementations, the first processor unit 102 is a quantum processor unit, which may be similar to the quantum processor unit 106. In some instances, the first processor unit 102 can operate as a host or master component that invokes, calls, or otherwise controls the operation of the quantum processor unit 106. The quantum processor unit 106 may operate autonomously, or may be controlled by a different component, other than the first processor unit 102.

In the example shown in FIG. 1A, the quantum processor unit 106 can include any type of data processing hardware device that can encode and process information in quantum states (e.g., quantum states of light, quantum states of matter or both). In some cases, the quantum processor unit 106 can be configured to execute quantum processes that perform certain computational tasks more efficiently than other types of processors. For instance, the quantum processor unit 106 may be programmed to solve for eigenvalues (e.g., as a quantum variational eigensolver), perform a quantum Fourier transform, factor large integers (e.g., Shor's algorithm), simulate a quantum system or Schrodinger equation model, perform a search (e.g., Grover's algorithm), estimate quantum phases, or other types of computational tasks.

The example quantum processor unit 106 may include qubit devices or other components that are used to store and process quantum information. For example, each qubit device may store a single qubit (a bit of quantum information), and the qubits can collectively define a computational state. In some implementations, the quantum processor unit 106 can process the quantum information stored in the qubits by applying control signals to the qubit devices or other control devices in the quantum processor unit 106. In some examples, the operations can be expressed as single-qubit gates, two-qubit gates, or other types of quantum logic gates that operate on one or more qubits.

The example quantum processor unit 106 may perform quantum processes by leveraging large-scale entanglement and other quantum resources. In some instances, the quantum processor unit 106 may operate in a fault-tolerant regime, for instance, using quantum error correction and other control techniques. Control signals within the quantum processor unit 106 can be used to manipulate the quantum states of qubits and to manipulate couplings between qubits. Information can be read out from the qubits, for example, by performing projective measurement of the quantum states or by other measurement techniques. In some implementations, the quantum processor unit 106 may operate in another manner.

In some implementations, the quantum processor unit 106 includes a superconducting circuit, and qubits can be implemented in fluxonium devices, transmon devices or another type of circuit device that includes one or more Josephson junctions, superconducting quantum interference device (SQUID) loops, or other features. Some example superconducting circuit devices (e.g., transmon devices and fluxonium devices) can be operated by microwave signals, DC-bias signals, or other types of electromagnetic signals delivered in the quantum processor unit 106, for example, from a control system. In some cases, the quantum processor unit 106 includes an ion trap system. For example, qubits may be implemented in hyperfine states of laser-cooled atomic ions and may be controlled by optical signals delivered to the atomic ions. In some cases, the quantum processor unit 106 includes a spin system, a photonic system or another type of quantum system that can be used for quantum information processing applications.

In the example shown in FIG. 1A, the first processor unit 102 and the quantum processor unit 106 may be configured to communicate with each other, for example, through a shared memory (e.g., the memory 104, an interconnect device, etc.), through a communication link (e.g., a data bus, a data network, etc.) or otherwise. In some implementations, an interconnect device, the memory 104 or another type of hardware component may serve as a shared memory system for the first processor unit 102 and the quantum processor unit 106. The shared memory system may include memory blocks or memory devices that are accessible by multiple processor devices. For instance, the shared memory system can include a memory block that is shared by the first processor unit 102 and the quantum processor unit 106, where both the first processor unit 102 and the quantum processor unit 106 have read and write access to the shared memory block. The same memory block may be shared by other processor units. The processors units may be connected to additional or different devices and systems.

In some instances, the first processor unit 102 or the quantum processor unit 106 (or both) is programmed by loading instructions from the memory 104. As an example, the memory 104 may store an instruction set defining a quantum process that can be executed by the quantum processor unit 106. The instruction set can be loaded to the quantum processor unit 106, and the quantum processor unit 106 can execute the quantum process by processing the instruction set. As another example, the memory 104 may store an instruction set defining one or more modules of a classical optimization algorithm (e.g., the construction process 110) that can be executed by the first processor unit 102. The instruction set can be loaded to the first processor unit 102, and the first processor unit 102 can execute the optimization process by processing the instruction set.

In some instances, the construction process 110 can be executed by the first processor unit 102 to construct a quantum process to be executed by the quantum processor unit 106. In some cases, the computer system 100 performs an iterative process, in which the first processor unit 102 iteratively executes operations to produce (or modify) a quantum process for execution by the quantum processor unit 106. For example, an instruction set defining the quantum process may be stored in the memory 104 and provided to the quantum processor unit 106; the quantum processor unit 106 may execute the instruction set and generate output values; the output values may be provided to the first processor unit 102 (e.g., through the memory 104) for an execution of the optimization process to modify the instruction set defining the quantum process.

The example construction process 110 shown in FIG. 1A includes: at 112, a quantum process $F_\alpha$ that includes a parameter set $\alpha$; at 114, quantum process data $F_\alpha$: I→$S_\alpha$; at 116, training data D: I→S; at 118, an objective function $O(\alpha)$; and at 120, an optimization engine. In some implementations, the quantum process $F_\alpha$ (and/or its parameter set $\alpha$) can be constructed or modified by the construction process 110. The construction process 110 can operate based on inputs I and target outputs S in the training data set, which labels D: I→S and assigns each input to a target output. The inputs I can include, for example, a set or subset of computational basis states, a set of states that sample a Hilbert space or subspace, a random set of states or another set of quantum states. The target outputs S can include, for example, for each of the inputs I, the output state generated by an ideal or target execution of the quantum process $F_\alpha$. In some cases, the target outputs S can be estimates of the ideal or target outputs for each of the inputs I. The construction process 110 also operates based on a quantum process data set, which labels $F_\alpha$: I→$S_\alpha$ and associates each input to an output produced by the quantum process $F_\alpha$ with the parameter set $\alpha$.

The parameters $\alpha$ of the quantum process $F_\alpha$ can represent, for example, properties of the quantum logic circuit(s), quantum logic gate(s), control sequences or other operations that execute the quantum process. The optimization engine can vary the parameters a toward optimizing the objective function $O(\alpha)$. For example, the optimization engine may iteratively modify (increase or decrease) one or more of the parameters $\alpha$ to reduce or minimize the example objective function:

$$O(\alpha) = \sqrt{\sum_i (D(H_i) - F_\alpha(H_i))^2}.$$

Other objective functions may be used. In some cases, by iteratively modifying the parameters α toward optimizing the objective function, the quantum process $F_\alpha$ can be trained to produce the desired input-output mapping. In some cases, a quantum process can be optimized under the objective function for the training data set and possibly other constraints. In some cases, varying the parameters α incorporates changes of the underlying functional architecture, changes of the underlying quantum logic gate set or other changes to the quantum process.

In some implementations, the construction process 110 can include operations that are iterated, for example, for a specified number of iterations, until the objective function reaches a target value (e.g. a threshold) or until another type of terminating condition is reached. In the example shown in FIG. 1A, the training data sets D: I→S can be used on each iteration of the construction process 110. On each iteration, a current construction of the quantum process $F_\alpha$ can be identified based on a current set of parameters α, and quantum process data $F_\alpha$: I→$S_\alpha$ can be obtained for the current construction of the quantum process $F_\alpha$. The objective function $O(\alpha)$ can then be calculated based on the current construction of the quantum process and the training data set. The optimization engine can obtain and analyze the current construction of the quantum process $F_\alpha$ and the output of the objective function $O(\alpha)$. The optimization engine can be or include, for example, a machine learning model or another type of optimization algorithm, which can update the parameters α, for example, to vary the quantum logic gate set, classical control parameters or other variable parameters. The optimization engine may vary the parameters α until, for example, an accuracy threshold for the objective function is reached. An updated construction of the quantum process $F_\alpha$ can be generated based on the parameter set output by the optimization engine. In some cases, an updated construction of the quantum process $F_\alpha$ produced by the optimization engine can be provided as the current construction for a subsequent iteration of the construction process 110, further improved or modified (e.g., by another process), or processed in another manner. In some cases, an updated construction of the quantum process $F_\alpha$ produced by the optimization engine can be provided as an acceptable, optimal or final construction, or it can be handled in another manner.

Figure 1B:
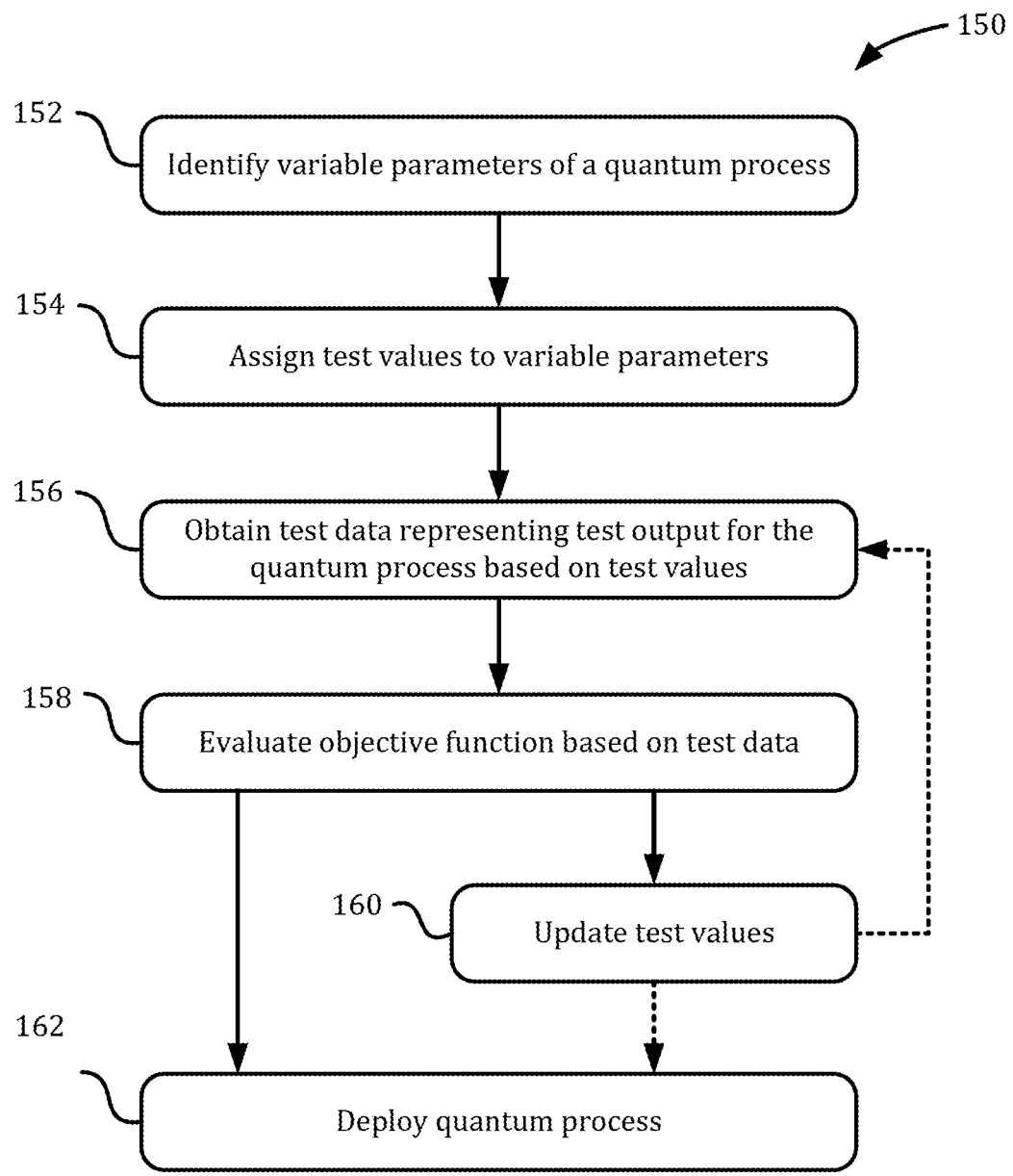
FIG. 1B is a flow chart of an example process for constructing a quantum process.

FIG. 1B is a flow chart of an example process 150 for constructing a quantum process. In some cases, one or more operations in the process 150 can be performed by a classical machine, a quantum machine or a combination of classical and quantum computer systems. For instance, in some cases, all or part of the process 150 can be performed by the computer system 100 shown in FIG. 1, or the process 150 can be performed by another type of system. The example process 150 may include additional or different operations, and the operations can be performed in the order shown or in another order.

The process 150 can construct (e.g., generate or modify) a quantum process for execution by a quantum processor, such as, for example, the quantum processor unit 106 shown in FIG. 1A. In some implementations, the quantum process is a quantum computing algorithm, and may be represented, for example, as a quantum Hamiltonian, as a series of unitary operations, as a quantum logic circuit, as a quantum logic gate, as a sequence of classical control operations or otherwise.

Figure 3:
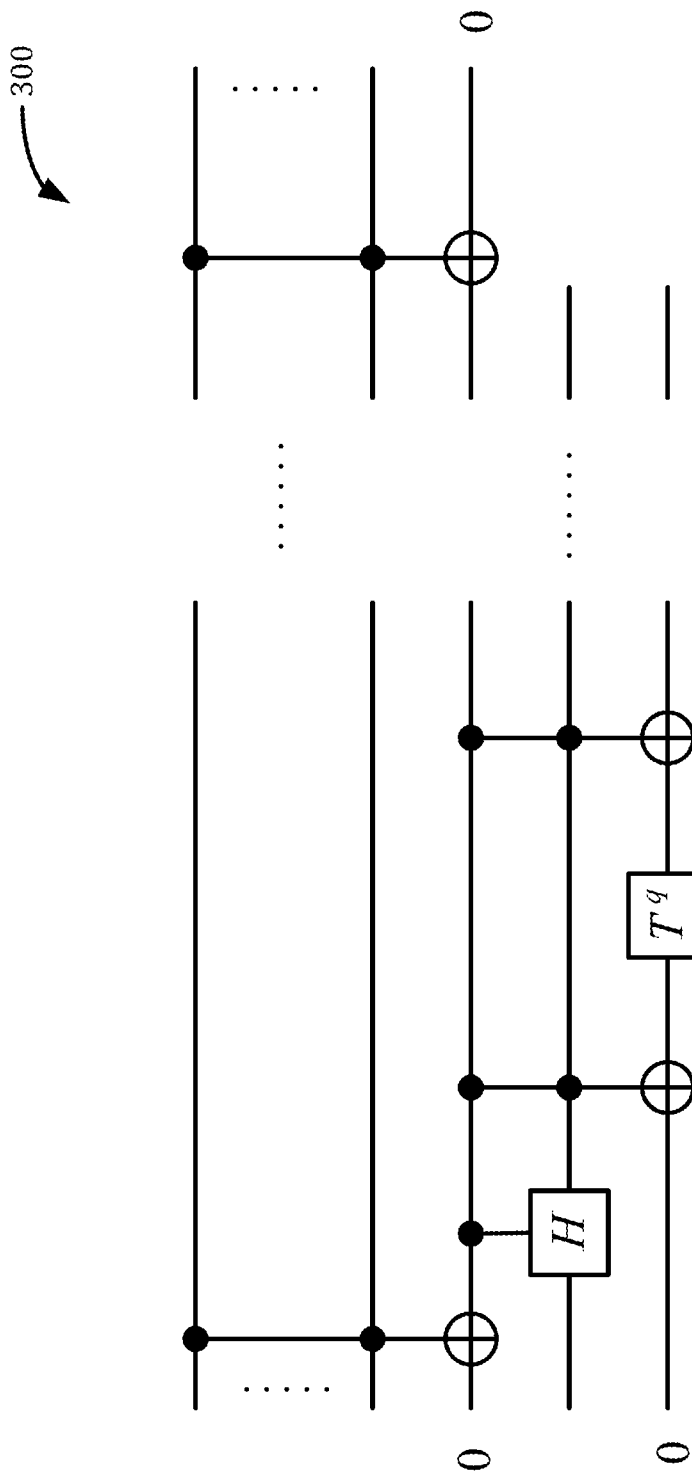
FIG. 3 is a diagram of an example quantum logic circuit for producing an ansatz in a quantum variational eigensolver algorithm.

As an example, the quantum process can be a quantum logic circuit configured to generate an ansatz in a quantum variational eigensolver (QVE), such as, for example, the quantum logic circuit 300 shown in FIG. 3. As another example, the quantum process can be a quantum logic gate that can be applied to one or more qubits in a quantum processor, such as, for example, a Hadamard gate, a controlled-not gate, a controlled-phase gate, etc.

In some examples, the quantum process is a quantum algorithm, and the process 150 performs gate compilation to build a quantum logic circuit that executes the quantum algorithm on a particular quantum processor architecture. For example, the quantum processor architecture may provide a library of quantum logic gates that can be performed in a particular quantum processor unit or a class of quantum processor units, and the process 150 may construct (from the quantum logic gates in the library) a quantum logic circuit that performs the quantum algorithm using the quantum logic gates in the library. In some cases, the process 150 can function as an automated process for creating or improving quantum logic circuits for arbitrary quantum algorithms, which can be optimized, for instance, for a particular hardware realization of an algorithm or for an abstract computational gate set.

The process 150 can construct the quantum process by analyzing and modifying variable parameters of the quantum process. The variable parameters of the quantum process can include quantum logic parameters, such as, for example, the number of times a quantum logic gate is applied in a quantum logic circuit, the rotation angle of a quantum logic gate (e.g., of a quantum logic gate that applies a rotation or controlled-rotation to a qubit), the type of gate to apply in a quantum logic circuit or others. The variable parameters of the quantum process can include classical control parameters for the quantum processor, such as, for example, the duration, frequency, shape, or amplitude of a microwave pulse, a laser pulse, a tuning pulse or another type of signal. The variable parameters of the quantum process can include architectural parameters of the quantum processor, such as, for example, the connectivity or operating parameters of devices in the quantum processor, the types of quantum logic gates or classical control operations applied to the devices in the quantum processor or others. In some cases, the variable parameters of the quantum process can include a combination of these or other types of parameters.

At 152, one or more variable parameters of the quantum process are identified. For example, quantum logic parameters, classical control parameters, architectural parameters or a combination of them can be identified for analysis. In some cases, the quantum process includes many variable parameters, and only a single variable parameter or a subset of the variable parameters is identified at 152. In some cases, all variable parameters of the quantum process are identified at 152.

In some examples, a variable parameter of a quantum logic circuit is identified at 152. For instance, the variable parameter of the quantum logic circuit may represent the number of times a particular quantum logic gate is applied in the quantum logic circuit. As an example, the variable parameter can be the value q in FIG. 3, which represents the number of times the T-gate is applied in the example quantum logic circuit 300.

In some examples, a variable parameter of a quantum logic gate is identified at 152. For instance, the variable parameter of the quantum logic gate may represent a parameter of a control sequence that causes the quantum processor to execute the quantum logic gate. As an example, if the quantum processor is a superconducting quantum circuit, the variable parameter can be a parameter of a control signal that causes the superconducting quantum circuit to execute the quantum logic gate. Example parameters of a control signal for a superconducting quantum circuit include the duration, frequency, shape, or amplitude of microwave pulses, a tuning pulses and other electromagnetic signals.

At 154, test values are assigned to the variable parameters identified at 152. The initial test values may be considered a starting point for constructing the quantum process. In some cases, the test values assigned at 154 are randomly generated, computed or derived from a library or other standard set of values, computed or derived from a set of constants or otherwise selected. In some cases, the test values assigned at 154 are generated based on another quantum process or based on numerical simulations of the quantum process. The test values assigned at 154 may be selected in another manner.

At 156, test data representing a test output for the quantum process are obtained based on the test values. In some cases, the test output is generated by a quantum processor executing the quantum process with the test values assigned (at 154) to the variable parameters, and the test data represent all or part of the test output generated by the quantum processor. For instance, in the example shown in FIG. 1A, the test output can be a set of output states $S_\alpha$ generated for each input I by the quantum processor unit 106 executing the quantum process $F_\alpha$ with parameters $\alpha$, and the test data can be a data set (e.g., stored in the memory 104) that represents the quantum process data $F_\alpha: I \rightarrow S_\alpha$.

In some cases, the test output is generated by a classical processor simulating the quantum process with the test values assigned (at 154) to the variable parameters, and the test data represent all or part of the test output generated by the simulation. For instance, in the example shown in FIG. 1A, in a case where the first processor unit 102 is a classical processor, the test output can be a set of output states $S_\alpha$ generated for each input I by the first processor unit 102 simulating the quantum process $F_\alpha$ with parameters $\alpha$, and the test data can be a data set (e.g., stored in the memory 104) that represents the quantum process data $F_\alpha: I \rightarrow S_\alpha$.

At 158, an objective function is evaluated based on the test output of the quantum process. The objective function can be evaluated based on the test output and a training data set that includes training outputs associated with respective training inputs. For instance, in the example shown in FIG. 1A, the first processor unit 102 can access the test data (e.g., from the memory 104) and evaluate the objective function $O(\alpha)$ based on the test data $F_\alpha: I \rightarrow S_\alpha$ and the training data D: $I \rightarrow S$ for the quantum process. The training data can include, or can be generated from, for example, a quantum simulation benchmark (e.g., for a quantum chemical system or other quantum system), ground states (or ground state energies) for molecular structures, or other types of training data.

In some examples, the quantum process includes a quantum logic circuit configured to generate an ansatz in a quantum variational eigensolver (QVE). In such examples, the training inputs can be the molecular structures (e.g., Hamiltonians or other representations of molecular structures), and the training outputs can be the known (e.g., measured or computed) values of the ground state energies for each molecular structure. The test data obtained at 156 can be the computed values of ground state energies generated by an execution or simulation of the quantum process with the test values assigned to the variable parameters, and the objective function can be evaluated based on the known values and computed values of the ground state energies.

The objective function evaluated at 158 can be a function (e.g., a cost function) that quantifies the distance between training outputs (e.g., target or ideal outputs) and test outputs. For instance, the objective function can be a cost function that includes a weighted or unweighted sum, an average state fidelity, a total diamond-norm distance, a cross-entropy, or another measure of quality for a quantum process.

At 160, the test values for the variable parameters are updated. For example, a second, different value can be assigned to a variable parameter identified at 152. The updated values assigned at 160 are based on the evaluation of the objective function at 158. The test values can be updated by an optimization algorithm, which can be implemented, for example, on a classical or quantum machine. The optimization algorithm can be executed by an optimization engine or machine learning engine that is programmed to optimize (e.g., minimize) the objective function. Accordingly, the optimization algorithm can update the test values for the variable parameters toward improving (e.g., reducing) the objective function for the quantum process. Example optimization algorithms include gradient descent, Nelder-Mead, Boltzmann machine, long short-term memory neural networks, convolution neural networks, or other deep learning techniques.

As shown in FIG. 1B, the process 150 can be an iterative process that includes multiple iterations, where each iteration of the iterative process is based on the current test values assigned to the variable parameters. At 156, the test data obtained for the current iteration of the iterative process can be based on the current test values; at 158, the objective function can be evaluated based on the test data for the current iteration; and at 160, new test values can be computed and assigned to the variable parameters. The iterative process can then return to 156 for a subsequent iteration of the iterative process, with the new test values being assigned to the variable parameters. Test data obtained in the subsequent iteration (at 156) are based on the new test values assigned to the set of variable parameters (at 160) in the preceding iteration. The iterative process may include a decision function that determines (e.g., after 158 or 160) whether to terminate the iterative process. For instance, the decision function may compare the current value of the objective function with a threshold value. In some instances, if the current value of the objective function satisfies the decision criteria, the test values currently assigned to the variable parameters may be considered acceptable.

At 162, the quantum process is deployed. For instance, the quantum process having the updated test values assigned to the variable parameters can be provided for execution by the quantum processor. In some implementations, a single variable parameter or a set of variable parameters can be analyzed and modified by the process 150; and the quantum process deployed at 162 can represent a version of the quantum process that has been optimized or otherwise improved over the single variable parameter or the set of variable parameters. In some cases, the quantum process deployed at 162 has the set of values assigned to the set of variable parameters in the most recent update at 160.

Figure 2:
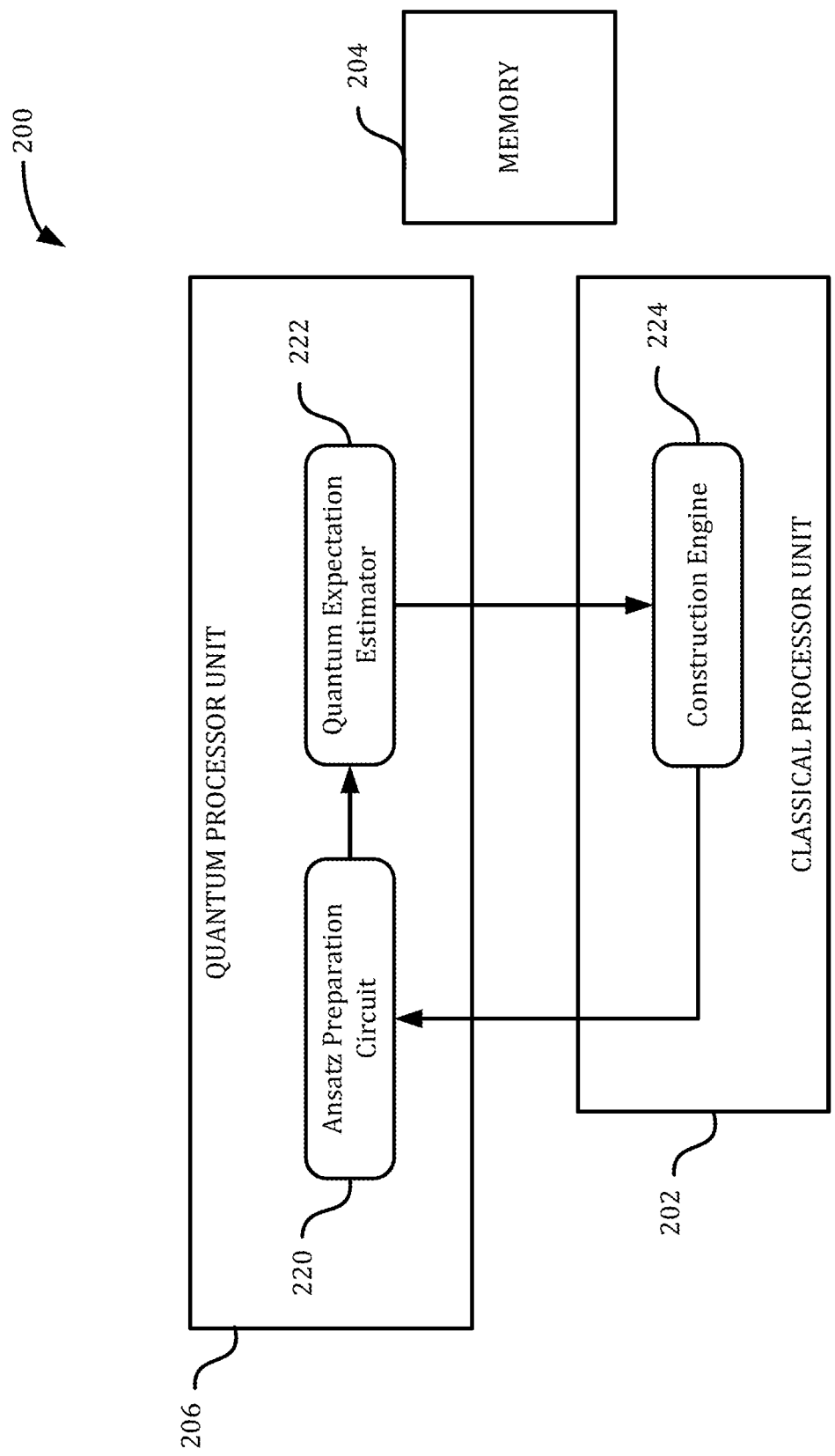
FIG. 2 is a block diagram of an example computer system.

FIG. 2 is a block diagram of an example computer system 200. The example computer system 200 shown in FIG. 2 includes a memory 204 and two distinct processors: a classical processor unit 202 and a quantum processor unit 206. The computer system 200 may include additional or different types of processors, and may include one or more of each type of processor shown.

The example computer system 200 shown in FIG. 2 represents an example implementation of the computer system 100 shown in FIG. 1A, in which the first processor unit 102 is a classical processor. For instance, the example quantum processor 206 can be implemented as the example quantum processor 106 shown in FIG. 1A, and the example memory 204 can be implemented as the example memory 104 shown in FIG. 1A. In the example shown in FIG. 2, the quantum process $F_\alpha$ is a quantum variational eigensolver (QVE) algorithm, and a construction process optimizes the portion of the quantum variational eigensolver (QVE) algorithm that generates an ansatz.

In some implementations, given N qubits, a quantum variational eigensolver can find eigenvalues and eigenvectors for a Hermitian matrix of size $2^N \times 2^N$. Let H be a Hermitian matrix with complex elements that is size $2^N \times 2^N$ and has a set of eigenvalues $\{\lambda_i\}$ and eigenvectors $|x_i\rangle$. Then for an arbitrary $2^N$-dimensional vector $|y\rangle$ the variational principle holds:

$$\langle H \rangle = \frac{\langle y|H|y\rangle}{\langle y|y\rangle} \geq \lambda_0,$$

where $\lambda_0$ is the lowest eigenvalue. Equality holds only if $|y\rangle = |x_0\rangle$. This algorithm can be applied to quantum simulations, where the matrix H is an electronic structure Hamiltonian. In this case, $\lambda_0$ is the ground state energy and $|x_0\rangle$ is the ground state of the simulated system.

A quantum variational eigensolver algorithm can receive, as input, a ground state or another well-defined state, produce an ansatz based on a current value of a parameter, compute the expectation value for the ansatz by projectively measuring the Hermitian matrix, and determine a new value of the parameter that will reduce the expectation value. Here, by minimizing the expectation value, the lowest eigenvalue and the associated eigenvector are found. In some cases, the ansatz may be represented as the vector $|y(\vec{\theta})\rangle$, where $\theta$ represents one or more variable parameters of the ansatz. The quantum variational eigensolver algorithm may proceed with the following operations, in a classical optimization loop: (i) set the parameters $\vec{\theta}$ for an ansatz $|y(\vec{\theta})\rangle$; (ii) prepare the state $|y(\vec{\theta})\rangle$ on the quantum processor; (iii) projectively measure to calculate $\langle H \rangle$; and (iv) determine new parameters $\vec{\theta}'$ and return to (i).

A common choice of parameterized ansatz for the QVE algorithm described above is the unitary coupled cluster ansatz, which can be prepared using quantum logic circuits such as, for example, the quantum logic circuit 300 shown in FIG. 3. An example representation of the parameters $\alpha$ would then include a list of applied gates that specifies on which qubit and at which time step the gate acts. In the example shown in FIG. 3, the quantum logic circuit includes controlled not gates, a controlled Hadamard gate and a repeatedly-applied T gate. Here, the T gate, the Hadamard gate and the controlled-not gate are represented, respectively, as $$T = \begin{bmatrix} 1 & 0 \\ 0 & e^{i\pi/4} \end{bmatrix};$$

$$H = \frac{1}{\sqrt{2}}\begin{bmatrix} 1 & 1 \\ 1 & -1 \end{bmatrix};$$

$$CNOT = \begin{bmatrix} 1 & 0 & 0 & 0 \\ 0 & 1 & 0 & 0 \\ 0 & 0 & 0 & 1 \\ 0 & 0 & 1 & 0 \end{bmatrix}.$$

In some implementations, a QVE algorithm can be validated, for example, by comparing the results of its calculation with laboratory measurements of molecular ground state energies or with accurate classical simulation results.

In some cases, the example construction process 110 shown in FIG. 1A, the example process 150 shown in FIG. 1B or another process can be used to develop quantum logic circuits that produce new and improved ansatzes for a QVE algorithm. For example, assume some specific finite quantum logic gate set that can be implemented on a particular quantum processor as the underlying quantum logic gate set. While this quantum logic gate set can be arbitrarily chosen and does not have to correspond to physical hardware, one may choose the quantum logic gate set to optimize for specific hardware. Choose a training data set of molecular Hamiltonians paired with their ground state energies. This training data set can include laboratory measurements or ground state energies calculated by simulation. The training data set can be defined as a function $D:\{H_i\} \to \mathbb{R}$ from the set of Hamiltonians to their corresponding ground state energy. The QVE algorithm can be denoted with some ansatz circuit a as a function $QVE_{\{\alpha\}}:\{H_i\} \to \mathbb{R}$ from the set of Hamiltonians to the output ground state energy. The objective function can be expressed, for some ansatz $\alpha$, as the mean squared difference between the data set energy and the QVE energy using that ansatz, for example:

$$O(\alpha) = \sqrt{\sum_i (D(H_i) - QVE_\alpha(H_i))^2}.$$

The ansatz $\alpha$ can be varied by appending, inserting, or removing gates from the computational gate set to particular qubits used in the algorithm. In some instances, a can be varied by other physical parameters, such as by shaping microwave pulses used to implement the gates.

As shown in FIG. 2, an ansatz preparation circuit 220 and a quantum expectation estimator circuit 222 are examples of quantum logic circuits that can be loaded (e.g., from memory 204 or from another source) onto and executed by the quantum processor unit 206. The construction engine 224 is a classical optimization process (such as, for example, the construction process 110 shown in FIG. 1A or another type of process) that can be loaded (e.g., from memory 204 or from another source) onto and executed by the classical processor unit 202. The construction engine 224 is executed by the classical processor unit 202 to improve the ansatz preparation circuit 220, for example, by modifying variable parameters of the ansatz preparation circuit 220.

In some instances, an improved ansatz preparation circuit 220 within the QVE algorithm can be developed by minimization of the objective function $O(\alpha)$ under varying $\alpha$. This reduction to objective function minimization may allow one to use classical machine learning, quantum machine learning or a combination of these or other machine learning techniques to improve the ansatz. In some implementations, a machine learning system can be implemented on a classical computing system, on a quantum computing system, or on a hybrid classical-quantum computing system. In some cases, the test quantum logic circuit is evaluated using a quantum simulator or quantum computer (multiple iterations, in some cases) to calculate QV $E_\alpha(H_i)$.

FIG. 3 is a diagram of an example quantum logic circuit 300 for producing an ansatz in a quantum variational eigensolver (QVE) algorithm. The example quantum logic circuit 300 includes a series of quantum logic gates applied to qubits. As shown in FIG. 3, the qubits may begin in a ground state, represented by the computational state 000 . . . 0. The quantum logic gates include a number of controlled-not gates and a controlled-Hadamard gate, and a variable number of T-gates. In particular, the variable parameter q indicates the number of applications of the T-gate in the quantum logic circuit. The quantum logic circuit 300 can produce an ansataz in the quantum variational eigensolver algorithm described above. In some instances, the variable parameter q can be optimized or otherwise selected by an automated machine-learning process, such as, for example, the construction process 110 shown in FIG. 1A, the process 150 shown in FIG. 1B, or another process.

Some of the subject matter and operations described in this specification can be implemented in digital electronic circuitry, or in computer software, firmware, or hardware, including the structures disclosed in this specification and their structural equivalents, or in combinations of one or more of them. Some of the subject matter described in this specification can be implemented as one or more computer programs, i.e., one or more modules of computer program instructions, encoded on a computer storage medium for execution by, or to control the operation of, data-processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

Some of the operations described in this specification can be implemented as operations performed by a data processing apparatus on data stored on one or more computer-readable storage devices or received from other sources.

The term "data-processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and processors of any kind of digital computer. Generally, a processor will receive instructions and data from a read-only memory or a random-access memory or both. Elements of a computer can include a processor that performs actions in accordance with instructions, and one or more memory devices that store the instructions and data. A computer may also include, or be operatively coupled to receive data from or transfer data to, or both, one or more mass storage devices for storing data, e.g., magnetic disks, magneto optical disks, or optical disks. However, a computer need not have such devices. Devices suitable for storing computer program instructions and data include all forms of non-volatile memory, media and memory devices, including by way of example semiconductor memory devices (e.g., EPROM, EEPROM, flash memory devices, and others), magnetic disks (e.g., internal hard disks, removable disks, and others), magneto optical disks, and CD ROM and DVD-ROM disks. In some cases, the processor and the memory can be supplemented by, or incorporated in, special purpose logic circuitry.

A computer system may include a single computing device, or multiple computers that operate in proximity or generally remote from each other and typically interact through a communication network. Examples of communication networks include a local area network ("LAN") and a wide area network ("WAN"), an inter-network (e.g., the Internet), a network comprising a satellite link, and peer-to-peer networks (e.g., ad hoc peer-to-peer networks). A relationship of client and server may arise by virtue of computer programs running on the respective computers and having a client-server relationship to each other.

In a general aspect, a quantum process for execution by a quantum processor is generated.

In a first example, one or more variable parameters of a quantum process are identified. Test data representing a test output of the quantum process are obtained. The test data are based on a first value being assigned to a first variable parameter. A computer system evaluates an objective function based on the test output of the quantum process. A second, different value is assigned to the first variable parameter based on the evaluation of the objective function. The quantum process having the second value assigned to the first variable parameter is provided for execution by a quantum processor.

In a second example, a computer system includes a data processing apparatus and a non-transitory computer-readable medium storing instructions that are operable when executed by the data processing apparatus to perform one or more of the operations of the first example.

Implementations of the first or second example may include one or more of the following features. The objective function can be evaluated based on the test data and training data for the quantum process, and the training data can include training outputs associated with respective training inputs. The quantum process can include a quantum logic circuit configured to generate an ansatz in a quantum variational eigensolver (QVE). The objective function can be evaluated based on the test data and training data for the quantum logic circuit, and the training data can include a ground state energy for a molecular structure.

Implementations of the first or second example may include one or more of the following features. The quantum process can be a quantum logic circuit, and the first variable parameter can be a parameter of the quantum logic circuit. The quantum process can be a quantum logic gate, and the variable parameter can be a parameter of a control sequence that causes the quantum processor to execute the quantum logic gate. The quantum processor can be a superconducting quantum circuit, and the variable parameter can be a parameter of a control signal that causes the superconducting quantum circuit to execute the quantum logic gate.

Implementations of the first or second example may include one or more of the following features. The test data may be obtained by the quantum processor executing the quantum process having the first value assigned to the first variable parameter. Test data may be obtained by a classical processor simulating the quantum process having the first value assigned to the variable parameter.

Implementations of the first or second example may include one or more of the following features. The first variable parameter can be part of a set of variable parameters of the quantum process, and the test data can be based on a first set of values being assigned to the set of variable parameters. A second, different set of values can be assigned to the set of variable parameters based on the evaluation of the objective function, where the second set of values includes the second value assigned to the first variable parameter. The quantum process provided for execution by the quantum processor can have the second set of values assigned to the set of variable parameters.

Implementations of the first or second example may include one or more of the following features. An iterative process can include multiple iterations. Each iteration of the iterative process can include obtaining test data for the current iteration of the iterative process, the test data for the current iteration based on a current set of values assigned to the set of variable parameters; evaluating the objective function based on the test output for the current iteration; computing updated values for the set of variable parameters based on the evaluation of the objective function; and assigning the updated values to the set of the variable parameters for a subsequent iteration of the iterative process.

Implementations of the first or second example may include one or more of the following features. The objective function may be optimized over the set of variable parameters. The quantum process can include a quantum variational eigensolver, a Schrodinger equation simulation, a quantum optimization algorithm or another type of quantum process. The objective function may be evaluated by a classical processor or a quantum processor. The objective function can be quantum process fidelity, quantum state fidelity or another objective function. A superconducting quantum processor can produce the test data, and the set of variable parameters can include applied microwave or laser pulse shapes that are used to execute a quantum logic gate or quantum logic circuit. The first variable parameter may represent the number of times one or more quantum logic gates are applied in the quantum process.

Implementations of the first or second example may include one or more of the following features. Training data sets are generated for improving the quantum process. Each training data set can include one or more training inputs mapped to one or more training outputs. The training inputs can include properties of quantum chemical systems, and the training outputs can include target quantum simulation benchmarks. The training inputs can include molecular structures, and the training outputs can include ground states or ground state energies associated with the molecular structures.

In a third example, a computer system includes a quantum processor unit and means for constructing a quantum process for execution by the quantum processor unit. Example means for constructing a quantum process include a processor unit (e.g., the first processor unit 102 shown in FIG. 1A, which may be implemented as one or more classical or quantum data processing apparatus) programmed to perform the construction process 110 shown in FIG. 1A or the process 150 shown in FIG. 1B. The quantum process can be a quantum logic circuit, a quantum logic gate or another type of quantum process. The computer system may include additional or different features, such as, for example, a memory shared by the quantum processor unit and one or more other processor units.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:
1. A method comprising:
identifying a variable parameter of a quantum process;
obtaining test data representing a test output of the quantum process, the test data based on a first value being assigned to the variable parameter;

by operation of a data processing apparatus, evaluating an objective function based on the test output of the quantum process;

assigning a second, different value to the variable parameter based on the evaluation of the objective function; and providing, for execution by a quantum processor, the quantum process having the second value assigned to the variable parameter.

2. The method of claim 1, wherein the objective function is evaluated using the test data and training data for the quantum process, the training data comprising training outputs associated with respective training inputs.

3. The method of claim 1, wherein the quantum process comprises a quantum logic circuit configured to generate an ansatz in a quantum variational eigensolver (QVE).

4. The method of claim 3, wherein the objective function is evaluated based on the test data and training data for the quantum logic circuit, the training data comprising a ground state energy for a molecular structure.

5. The method of claim 1, wherein the quantum process comprises a quantum logic circuit, and the variable parameter comprises a parameter of the quantum logic circuit.

6. The method of claim 1, wherein the quantum process comprises a quantum logic gate, and the variable parameter comprises a parameter of a control sequence that causes the quantum processor to execute the quantum logic gate.

7. The method of claim 6, wherein the quantum processor comprises a superconducting quantum circuit, and the variable parameter comprises a parameter of a control signal that causes the superconducting quantum circuit to execute the quantum logic gate.

8. The method of claim 1, wherein the test data are obtained by the quantum processor executing the quantum process having the first value assigned to the variable parameter.

9. The method of claim 1, wherein the test data are obtained by a classical processor simulating the quantum process having the first value assigned to the variable parameter.

10. The method of claim 1, wherein the variable parameter comprises a first variable parameter in a set of variable parameters of the quantum process, the test data are based on a first set of values being assigned to the set of variable parameters, and the method comprises:

assigning a second, different set of values to the set of variable parameters based on the evaluation of the objective function, the second set of values comprising the second value assigned to the first variable parameter; and providing, for execution by the quantum processor, the quantum process having the second set of values assigned to the set of variable parameters.

11. The method of claim 10, comprising executing an iterative process, each iteration of the iterative process comprising:

obtaining test data for the current iteration of the iterative process, the test data for the current iteration based on a current set of values assigned to the set of variable parameters;

evaluating the objective function based on the test output for the current iteration;

computing updated values for the set of variable parameters based on the evaluation of the objective function; and assigning the updated values to the set of variable parameters for a subsequent iteration of the iterative process.

12. A computer system comprising:
a data processing apparatus; and
a non-transitory computer-readable medium storing instructions that are operable when executed by the data processing apparatus to perform operations comprising:

obtaining test data representing a test output of a quantum process, the test data based on a first value being assigned to a variable parameter of the quantum process;

evaluating an objective function based on the test data;

assigning a second, different value to the variable parameter based on the evaluation of the objective function; and providing, for execution by a quantum processor, the quantum process having the second value assigned to the variable parameter.

13. The computer system of claim 12, wherein the objective function is evaluated based on the test data and training data for the quantum process, and the training data comprises training outputs associated with respective training inputs.

14. The computer system of claim 12, wherein the quantum process comprises a quantum logic circuit configured to generate an ansatz in a quantum variational eigensolver (QVE), the objective function is evaluated based on the test data and training data for the quantum logic circuit, and the training data comprise a ground state energy for a molecular structure.

15. The computer system of claim 12, wherein the quantum process comprises a quantum logic circuit, and the variable parameter comprises a parameter of the quantum logic circuit.

16. The computer system of claim 12, wherein the quantum process comprises a quantum logic gate, and the variable parameter comprises a parameter of a control sequence that causes the quantum processor to execute the quantum logic gate.

17. The computer system of claim 12, wherein obtaining the test data comprises:

providing, for execution by the quantum processor, the quantum process having the first value assigned to the variable parameter; and receiving the test data from the quantum processor, wherein the test data are generated by the quantum processor executing the quantum process having the first value assigned to the variable parameter.

18. The computer system of claim 12, wherein obtaining the test data comprises:

providing, for simulation by a classical processor, the quantum process having the first value assigned to the variable parameter; and receiving the test data from the classical processor, wherein the test data are generated by the classical processor simulating the quantum process having the first value assigned to the variable parameter.

19. The computer system of claim 12, wherein the variable parameter comprises a first variable parameter in a set of variable parameters of the quantum process, the test data are based on a first set of values being assigned to the set of variable parameters, and the operations comprise:

assigning a second, different set of values to the set of variable parameters based on the evaluation of the objective function, the second set of values comprising the second value assigned to the first variable parameter; and providing, for execution by the quantum processor, the quantum process having the second set of values assigned to the set of variable parameters.

20. The computer system of claim 12, comprising executing an iterative process, each iteration of the iterative process comprising:
   obtaining test data for the current iteration of the iterative process, the test data for the current iteration based on a current value assigned to the variable parameter;
   evaluating the objective function based on the test output for the current iteration;
   computing an updated value of the variable parameter based on the evaluation of the objective function; and
   assigning the updated value to the variable parameter for a subsequent iteration of the iterative process.

21. A computer system comprising:
   a quantum processor unit; and
   means for constructing a quantum logic circuit for execution by the quantum processor unit.

22. The computer system of claim 21, wherein the means for constructing a quantum logic circuit comprises a classical processor unit programmed to perform a construction process.

23. The computer system of claim 22, further comprising a memory shared by the quantum processor unit and the classical processor unit.

* * * * *

UNITED STATES PATENT AND TRADEMARK OFFICE
CERTIFICATE OF CORRECTION

| | |
|---|---|
| PATENT NO. | : 11,900,212 B1 |
| APPLICATION NO. | : 17/185675 |
| DATED | : February 13, 2024 |
| INVENTOR(S) | : Zeng et al. |

It is certified that error appears in the above-identified patent and that said Letters Patent is hereby corrected as shown below:

In the Specification

Column 10, Line 33 Delete "a" and insert -- $\alpha$ -- therefor

Signed and Sealed this
Twenty-eighth Day of May, 2024

Katherine Kelly Vidal
*Director of the United States Patent and Trademark Office*